United States Patent
Elabd

[19]

[11] Patent Number: 5,892,222
[45] Date of Patent: Apr. 6, 1999

[54] BROADBAND MULTICOLOR PHOTON COUNTER FOR LOW LIGHT DETECTION AND IMAGING

[75] Inventor: Hammam Elabd, Sunnyvale, Calif.

[73] Assignee: Loral Fairchild Corporation, Syosset, N.Y.

[21] Appl. No.: 634,637

[22] Filed: Apr. 18, 1996

[51] Int. Cl.[6] .................................................. G01J 3/50
[52] U.S. Cl. ........................ 250/226; 250/332; 257/184
[58] Field of Search ............................. 250/226, 214.1, 250/214 VT, 332, 370.08, 370.09, 372; 257/42, 21, 53–57, 184, 188, 200

[56] References Cited

U.S. PATENT DOCUMENTS

| | | | |
|---|---|---|---|
| 4,651,001 | 3/1987 | Harada et al. | 250/330 |
| 4,701,394 | 10/1987 | Inoue et al. | 430/57 |
| 4,900,975 | 2/1990 | Shimomoto et al. | 313/366 |
| 4,952,839 | 8/1990 | Tanioka et al. | 313/366 |
| 5,101,255 | 3/1992 | Ishioka et al. | 357/30 |
| 5,117,114 | 5/1992 | Street et al. | 250/370.11 |
| 5,162,885 | 11/1992 | Hunt et al. | 257/55 |
| 5,195,118 | 3/1993 | Nudelman et al. | 378/99 |
| 5,196,702 | 3/1993 | Tsuji et al. | 250/327.2 |
| 5,198,673 | 3/1993 | Rougeot et al. | 250/370.11 |
| 5,220,170 | 6/1993 | Cox et al. | 250/370.09 |
| 5,233,265 | 8/1993 | Takasaki et al. | 313/366 |
| 5,306,907 | 4/1994 | Nudelman | 250/214 VT |
| 5,311,010 | 5/1994 | Kruger | 250/214 VT |
| 5,319,206 | 6/1994 | Lee et al. | 250/370.09 |
| 5,399,882 | 3/1995 | Andoh et al. | 257/42 |
| 5,401,668 | 3/1995 | Kwasnick et al. | 437/3 |
| 5,463,225 | 10/1995 | Kwasnick et al. | 250/370.11 |
| 5,464,984 | 11/1995 | Cox et al. | 250/370.11 |
| 5,466,613 | 11/1995 | Andoh et al. | 437/3 |

*Primary Examiner*—Que Le
*Attorney, Agent, or Firm*—Perman & Green, LLP

[57] ABSTRACT

A low light level detection and imaging device including a photon sensing and counting device for image detection that is capable of detecting/imaging low photon flux levels over a wide spectral range using either image tube or solid state readout. The sensing and counting is composed of a detector stack having several photoconductive layers, at least one layer of the stack being an amorphous Selenium layer that is capable of high gain avalanche multiplication. The stack further includes an amorphous Silicon layer deposited on the amorphous Selenium layer to absorb infrared and ultraviolet radiation to enhance responsivity in the red and near-IR region, whereas the purpose of the amorphous Selenium layer is to provide high responsivity in the blue region and also to provide avalanche gain or multiplication of the photo generated carriers in both the amorphous Silicon or Selenium layers. Hence, the Selenium avalanching layer 12 provides low noise amplification for carriers injected from the Silicon layer into the Selenium layer.

14 Claims, 6 Drawing Sheets

BROADBAND MULTICOLOR PHOTON COUNTER FOR LOW LIGHT DETECTION AND IMAGING

BACKGROUND OF THE INVENTION

1. Field of the Invention

The present invention relates to low light level detection and imaging devices and more particularly to a photon sensing and counting device for image detection. It has applications in photomultiplier tubes (PMT), image intensifier tubes and solid state imaging sensors.

2. Description of the Background Art

References relating to the technology of photosensor devices using amorphous Selenium for charge multiplication are as follows.

U.S. Pat. No. 5,466,613 issued Nov. 14, 1995 to Andoh et al. entitled METHOD OF MANUFACTURING A CAMERA DEVICE and U.S. Pat. No. 5,399,882 issued Mar. 21, 1995 to Andoh et al. entitled CAMERA DEVICE AND METHOD OF MANUFACTURING THE SAME disclose a camera device having favorable multiplication characteristics (quantum efficiency) as well as improved sensitivity in a visible light region (especially the region on the red side) and a method of manufacturing the same are provided. The camera device includes a hole injection stop layer, a first photoelectric converting layer including selenium, a second photoelectric converting layer having spectral sensitivity characteristics which are different from those of the first photoelectric converting layer, a third photoelectric converting layer including selenium, and an electron injection stop layer. As a result, it is possible to improve multiplication characteristics (quantum efficiency) and to improve the sensitivity in the visible light region (especially the U.S. Pat. No. 5,101,255 issued Mar. 31, 1992 to Ishioka et al. entitled AMORPHOUS PHOTOELECTRIC CONVERSION DEVICE WITH AVALANCHE discloses a photoelectric conversion device which comprises: a photoconductive layer made of amorphous semiconductor material which shows charge multiplication and which converts photo signals into electric signals; and a substrate having electric circuits or the like (for example switching elements) for reading the electric signals. The amorphous semiconductor material used according to the invention shows the charge multiplication action under predetermined intensity of electric field so that a high sensitive photoelectric conversion device having a gain which is not smaller than 1 is realized.

U.S. Pat. No. 4,952,839 issued Aug. 28, 1990 and U.S. Pat. No. 4,888,521 issued Dec. 19, 1989 to Tanioka et al. entitled PHOTOCONDUCTIVE DEVICE AND METHOD OF OPERATING THE SAME discloses a photoconductive device having a photoconductive layer which includes an amorphous semiconductor layer capable of charge multiplication in at least a part thereof is disclosed. The method of operating such a photoconductive device is also disclosed. By using the avalanche effect of the amorphous semiconductor layer, it is possible to realize a highly sensitive photoconductive device while maintaining low lag property.

U.S. Pat. No. 4,900,975 issued Feb. 13, 1990 to Shimomoto et al. entitled TARGET OF IMAGE PICKUP TUBE HAVING AN AMORPHOUS SEMICONDUCTOR LAMINATE discloses a target of an image pickup tube is formed by laminating at least a transparent conductive film, an amorphous layer consisting essentially of silicon, and an amorphous layer consisting essentially of selenium in the above order on a light-transmitting substrate.

U.S. Pat. No. 4,883,562 issued Nov. 28, 1989 to Ogawa et al. entitled METHOD OF MAKING A PHOTOSENSOR discloses a method of making an image pickup tube target using an amorphous photoconductive layer. When an electrode, an amorphous semiconductor layer; etc. are provided on a substrate, the steps of ion etching away a surface of the substrate and forming the electrode are performed so that a target is produced in which no defects are substantially caused in a reproduced image even in a high electric field is applied across the target.

U.S. Pat. 4,701,394 issued Oct. 20, 1987 to Inoue et al. entitled IMAGE FORMING MEMBER FOR ELECTROPHOTOGRAPHY discloses an image-forming member for electrophotography comprises a photoconductive layer including as constituting layers, a hydrogenated amorphous silicon layer and an amorphous inorganic semiconductor layer. The amorphous inorganic semiconductor layer is laminated on the hydrogenated amorphous silicon layer to thereby provide a heterojunction.

At present, the state of the art in low light level imaging is based on image intensifier tubes followed by a tapered fiber optic face plate followed by a charge coupled device array to image the output screen. To achieve the resolution required of such a system is very costly and its performance under bright light leaves a lot to be desired.

The present invention provides an improved solid state imager or vidicon type tube with higher sensitivity and wider spectral band to enable more cost effective and higher performance TV sensors to be achieved. Broadening the spectral band of image pick up tubes and solid state image sensors allows the detection of objects that a human eye can not see. This is achieved by adding infrared and ultraviolet absorbers ahead of an avalanche multiplying layer and injecting excited hole type mobile carriers into the a-Se avalanching layer.

SUMMARY OF THE INVENTION

An object of the present invention is to provide a photon detecting and imaging device capable of detecting and imaging low photon flux levels over a wide spectral range using either image tube or solid state readout. The device of the present invention acts as a wavelength converter and provides high avalanche gain to photosignals.

Another object of the present invention is to provide a photon sensing and counting device using a plurality of stacked photoconductive layers including an amorphous Selenium layer fabricated for example by depositing an amorphous Silicon layer on an amorphous Selenium layer.

A further object of the present invention is to utilize the a-Se layer as a carrier multiplying (amplifying) layer that is preceded by absorber layers that inject holes corresponding to selected wavelengths.

The device of the present invention described herein utilizes one or more stacks of photoconductive and absorbing layers to generate broad band spectral response of an image. The device is capable of providing different amounts of avalanche gains to different spectral components of the signal by sandwiching one or more amorphous Selenium carrier multiplier layer within the photoconductive layers. These amorphous Selenium layers may be of equal or different thicknesses depending on the amount of gain required and the maximum acceleration voltage that can be applied.

The invention is applicable in the manufacturing of image pick up tubes and solid state image sensors. It will yield improved image pick up tubes or improved solid state imaging devices.

Other and further features, advantages and benefits of the invention will become apparent in the following description taken in conjunction with the following drawings. It is to be understood that the forgoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DESCRIPTION OF THE PREFERRED EMBODIMENT

Figure 1:
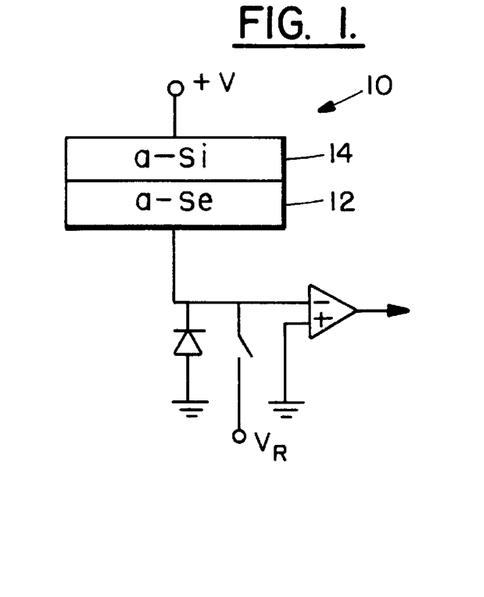
FIGS. 1 and 2 are schematic illustrations of an embodiment of stacked photoconductive layers with e-beam or image tube or solid state readout circuits.
Figure 2:
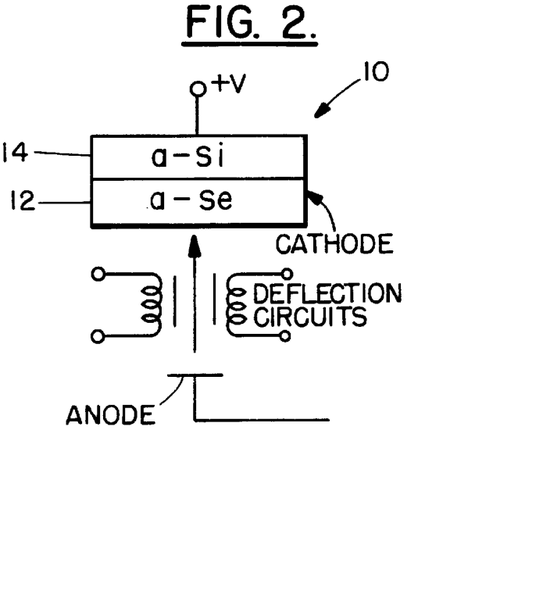

Referring to FIGS. 1 and 2 an imaging/photon detection device that is capable of detecting/imaging low photon flux levels over a wide spectral range using either solid state FIG. 1 or image tube, FIG. 2 readout is illustrated.

The device (sensor/counter) in both FIGS. 1 and 2 is formed by a detector stack composed of several photoconductive layers. At least one layer 12 of the stack is an amorphous Selenium layer that is capable of high gain avalanche multiplication (high gain avalanche rushing photoconduction-HARP). The a-Se layer is doped to extend its spectral response into the near infrared part of the spectrum, e.g., Te doping. The stack may be produced, for example, by depositing an amorphous Silicon layer 14 on the amorphous Selenium layer 12. The purpose of the amorphous Silicon layer 14 in this case is to function as an infrared and ultraviolet absorber enhance the responsivity in the red and near-IR region, whereas the purpose of the amorphous Selenium layer is to provide high responsivity in the blue region and also to provide avalanche gain or multiplication of the photo generated carriers in both the amorphous Silicon or Selenium layers 14 and 12. Hence, the Selenium avalanching layer 12 provides a low noise amplification process for carriers injected from the silicon layer 14 into the Selenium layer 12 without substantial increase in dark current. This is true because of the high resistivity ($10^{12}$ Ω cm) of the Selenium layer 12 and due to the very low avalanche gain imparted to the dark signal versus the photosignal produced by illumination. In the case of the Si-Se sandwich 10, the spectral window is broader, from x-ray to 1.0 μm, than that of Selenium-only layer 12 (which cuts off around 700 mm). The sensitivity in nA/lux is higher than that achieved by a silicon target. The increase in sensitivity corresponds to the avalanche gain produced by the selenium layer. Other stacks designed with other photoconductive layers may extend the response further into the SWIR and MWIR (in this case thermoelectric or cryogenic cooling may need to be provided to control the dark current levels) or by solid state readout such as that designed using amplified MOS multiplexer. The photocharge can be read out by either image tube, e-beam or solid state readout (FIG. 1A), image tube readout (FIG. 1B). Examples of other photoconductive layers are lead sulfide, selenium or telluride providing SWIR/MWIR sensitivity.

FIGS. 2A, 2B, 2C and 2D show the process of hole injection from the first photoconductive layer 14 (e.g. a-Si) into the a-Se avalanching layer 12. Then a hole avalanche process takes place in the a-Se layer 12. Finally the amplified photocurrent charges a capacitor, e.g., the detector node capacitance, that is read out. The amorphous Selenium layer 12 is doped by Te and As, to enhance its spectral window into the red region and prevent recrystallization of a-Se.

The hole avalanche process in the a-Se 12 is the result of the larger ionization coefficient of hole carriers compared to electron carriers $$(\alpha = 3.8 \times 10^7 \ e^{-1.5 \times 10^7/E} \text{ and } \beta = 1.7 \times 10^7 \ e^{-9.3 \times 10^6/E}.$$

The electrical injection of the hole at the top of the a-Se layer 12 allows it to benefit from maximum acceleration by the avalanching voltage and gives it maximum gain. This is why a-Se provides maximum gain to blue photons absorbed at the top surface, and more gain to photosignal than dark current.

This scheme also allows uniform gain to be given to all hole carriers generated in the absorber (a-Si layer 14) material by photons with different wavelengths.

Figure 2A:
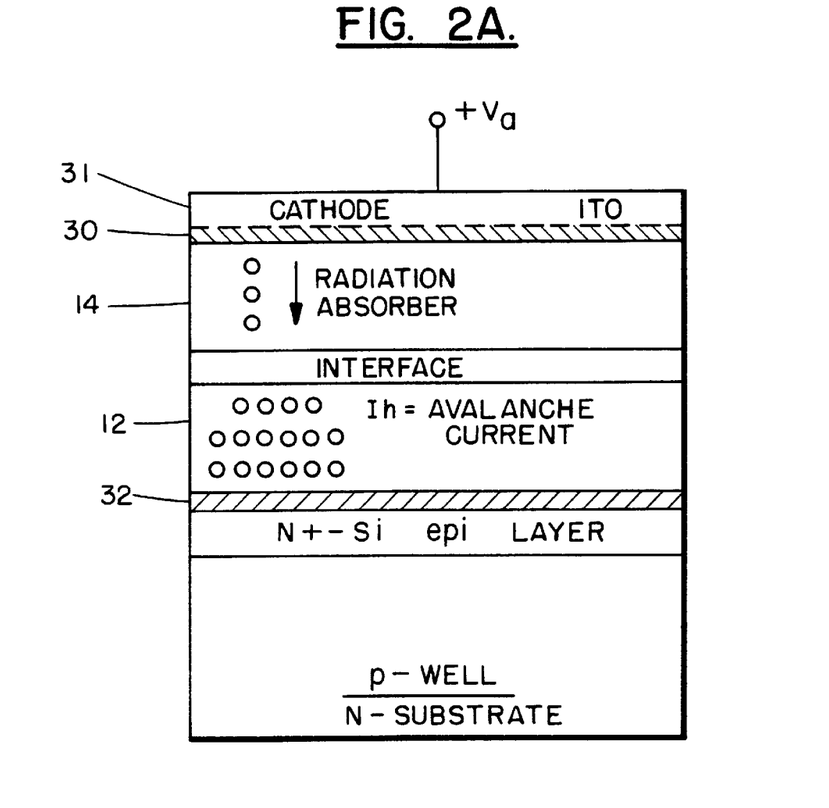
FIG. 2A–2D are schematic illustrations showing the process of hole injection from one of the layers of the embodiment of FIGS. 1 and 2 to another of the layers of this embodiment.

FIG. 2A further includes a transparent electrode (cathode) 31 that may be composed of indium tin oxide and biased by +Va, the accelerating voltage.

The hole blocking layer 30 for a-Si layer 14 may be fabricated from very thin $Si_3N_4$ or Schottky contact. The hole blocking layer in the case of a-Se can be fabricated from Germanium and/or Cerium oxides (e.g. $GeO_2$ or $CeO_2$). Similarly, electron injection is blocked by layer 32 at the lower electrode to the a-Se layer in this case it may be antimony trisulfide $Sb_2S_3$ or $Si_3N_4$ silicon nitride thin layer.

The purpose of the blocking contact layers 30, 32 above or below the photoconductive stack is to suppress the dark current to the $pA/cm^2$ range at room temperature or to charge an a-Se capacitor instead of a Silicon junction detector. However, the top bias electrode 31 and the top blocking contact 32 have to be optically transparent to increase the quantum efficiency of the photodetection process.

The internal amplification or the avalanche gain in Se varies with layer thickness and applied bias, the following table represents a projection of the expected gain values.

| GAIN | VOLTAGE (v) | THICKNESS (µm) |
|------|-------------|----------------|
| 30   | 240         | 2µm            |
| 100  | 680         | 6µm            |
| 180  | 800         | 8µm            |
| 1000 | 2000        | 25µm           |

This high avalanche gain is the result of higher free hole mobility and impact ionization coefficient with respect to free electron charge carriers.

Figure 2B:
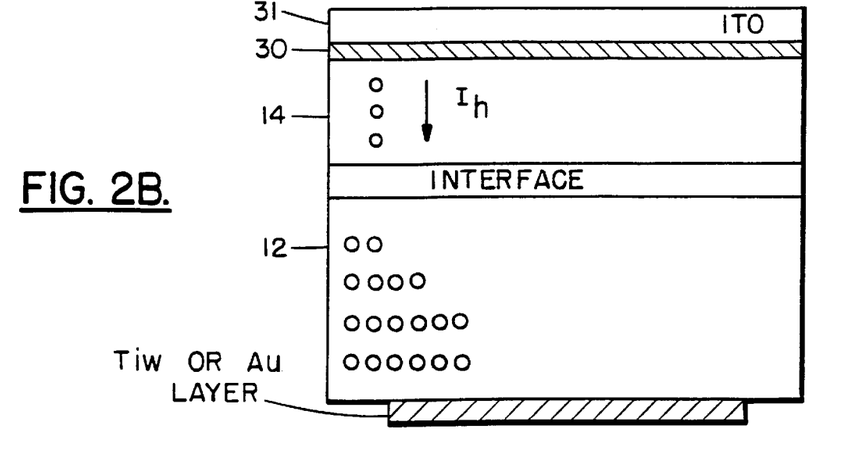
Figure 2C:
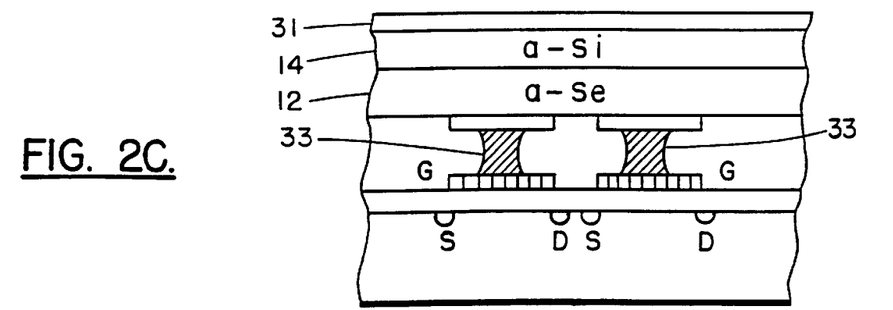

The stack described may be implemented on either monolithic solid state Si readout by deposition of a-Se on a planarized top surface as in FIG. 2A or by the construction of a hybrid solid state image sensor as in FIG. 2B. Here the stack is fabricated on a glass or sapphire substrate that is very flat to ensure uniformity of electric field and displacement vectors and hence benefit from avalanche gain prior to structure break down around film non-uniformity. The stack is connected to the readout circuit by Indium or PbSn bumps 33 as shown in FIG. 2C.

Figure 2D:
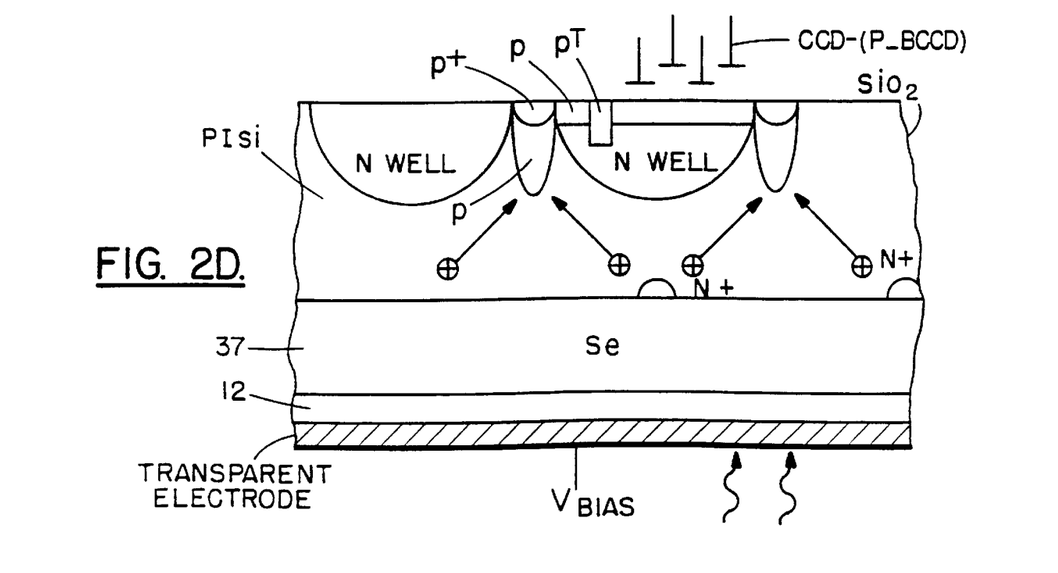

Alternatively, to improve surface uniformity and avoid electric fields at rough surface areas, the photoconductive stack may be deposited on the back side of the silicon device (which is very flat) then the amplified charge can be readout from a readout, e.g., CCD circuit 35 deposited on the front side of the device as illustrated in FIG. 2D which shows vertical readout of the a-Se layer 12 via direct injection from Se layer 37 into CCD circuit 35 using p-type CCD in N-wells to collect holes.

Figure 3:
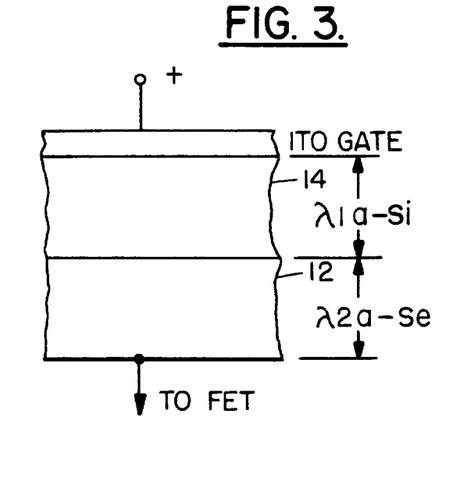
FIGS. 3, 4 and 5 illustrate different detector structures to achieve the composite spectral response of an amorphous silicon and an amorphous selenium layer combination with extended spectral response.
Figure 4:
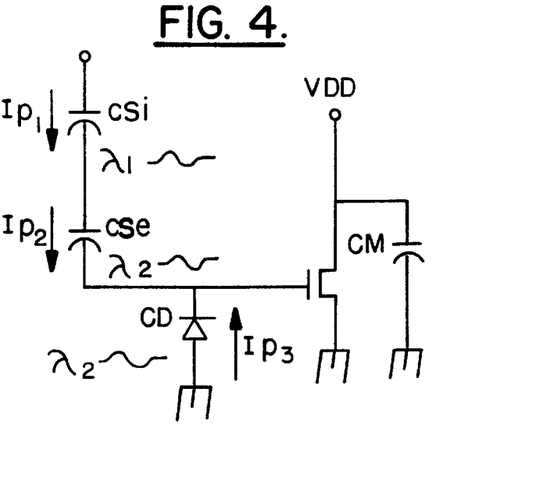
Figure 5:
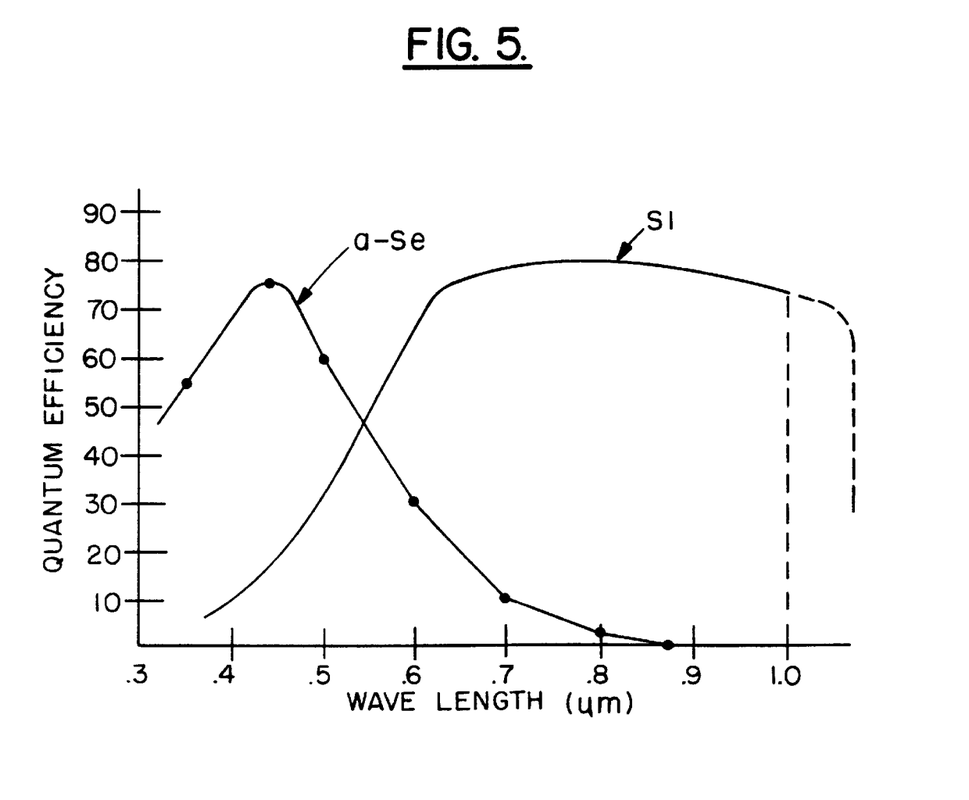

FIGS. 3, 4 and 5 show the composite spectral response of the a-Si, a-Se sandwich with extended spectral response.

Similar composite spectral response curves can be predicted for other infrared or ultraviolet absorbers deposited on a-Se layers. In this case the spectral band will be broader starting from UV and ending at different IR cutoff wavelengths.

FIG. 3 illustrates how the stack utilizes photoconductive action in both a-Si and a-Se layers to detect photons.

FIG. 4 illustrates how the stack utilizes photoconductive actions in a-Si and a-Se as well as photocurrent from absorption in underlying silicon diodes in the readout circuit. The diode polarity and reset circuits need to be adjusted to allow for a phase addition of photocurrents $Ip_1$, $Ip_2$ and $Ip_3$.

FIG. 5 shows the resulting broader spectral response of the stack.

Figure 6:
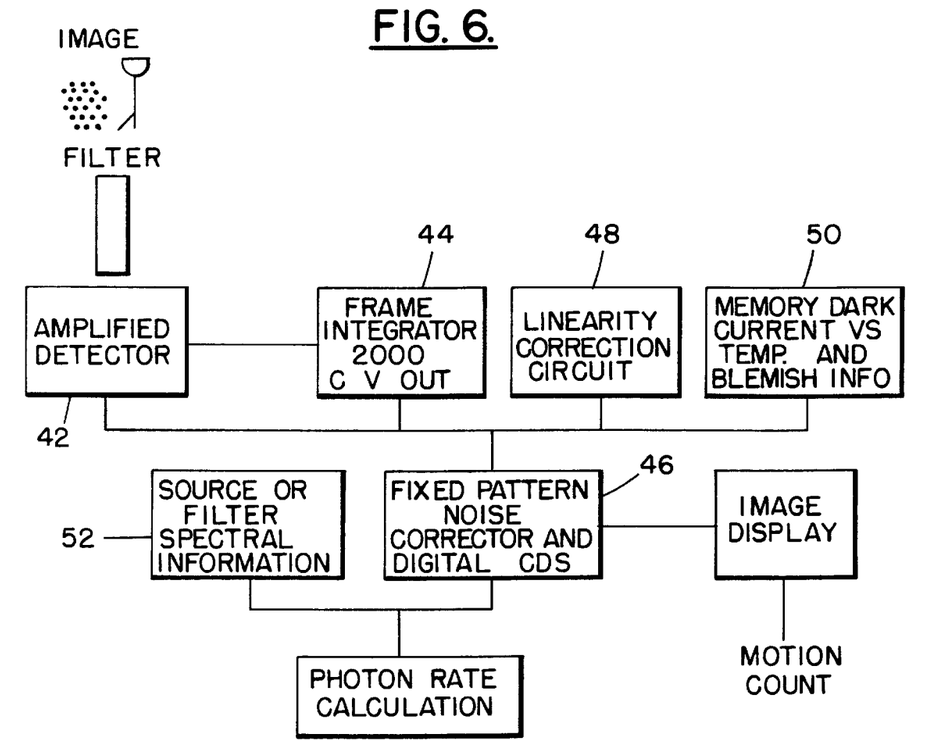
FIG. 6 shows a block diagram of a photon counter with the broadband detector, a frame integrator and external uniformity, linearity and dark current correction.

FIG. 6 is an illustration of a block diagram of the photon counter (camera) with the broadband detector 42, a frame integrator 44 and external uniformity, linearity and dark current correction means 46, 48 and 50. The photon counter of FIG. 6 utilizes the spectral characteristics of the filter means 52 to calculate the photon count.

The avalanching photoconductive stack followed by an amplified solid state readout circuits of the present invention will be capable of providing up to a 1000 times gain and sensitivity improvement. This allows the camera shown on FIG. 6 to be operated at a much higher frame rate than normal solid state imaging camera. Block 44 will integrate or average the signal from several frames to achieve a better signal to noise ratio. Any nonlinearity associated with the transfer characteristics of the detector will be calibrated and corrected in block 48. Non-uniformities in pixel photoresponse including dark current versus temperature for each pixel will be subtracted out using one or two point correction algorithm in block 50.

The solid state image sensor can be operated with a shutter to interleave the readout of light and dark frames. In this case a digital correlated double sampling can be performed between these frames in block 46 to suppress 1/f noise and KTC noise associated with pixel reset of the amplified MOS readout array (the V-reset of FIG. 8).

Figure 7:
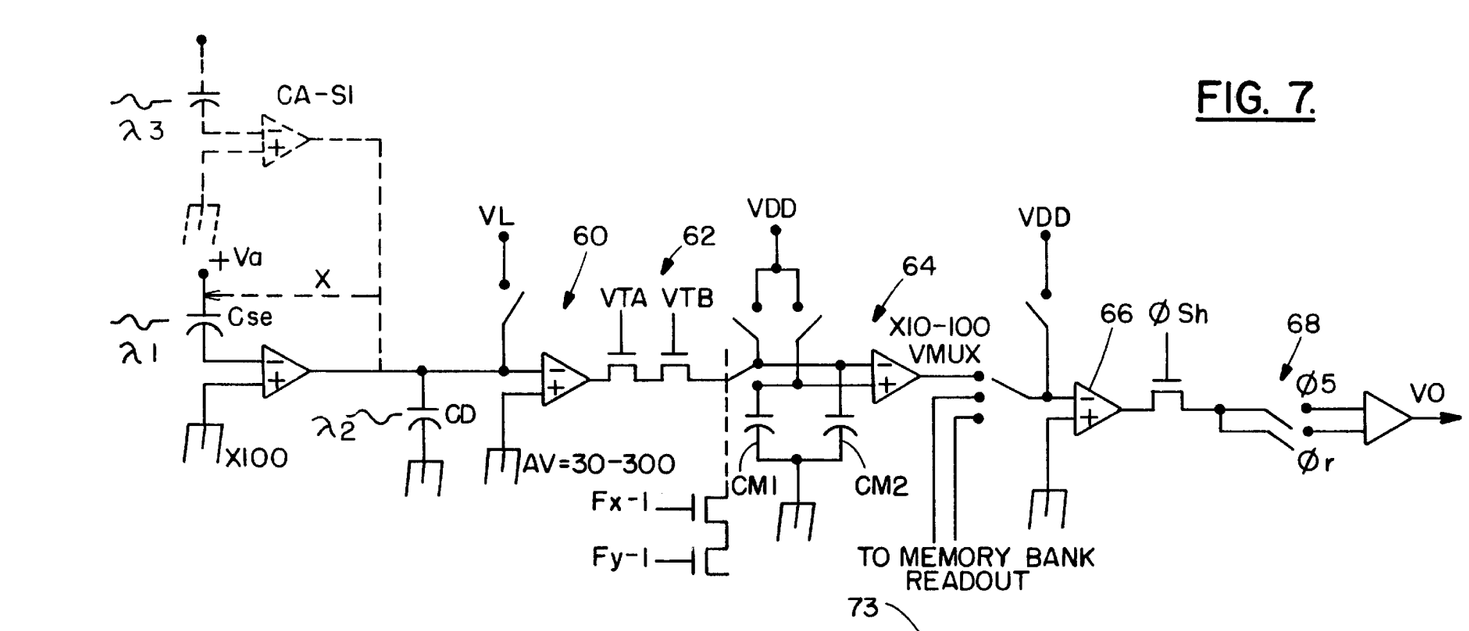
FIG. 7 shows a schematic circuit illustration of a multispectral photon counter with front end analog signal processing with correlated double sampling circuits.

FIG. 7 shows a multispectral photon counter with front end (on chip/off chip) analog signal processing with correlated double sampling circuits designed to remove reset and 1/f noise components from the video output of each pixel. A pixel amplifier 60 with 30–300 gain is followed by a CDS circuit 62 designed to remove noise and limit the bandwidth of the signal. The sampled data is stored in the $C_{M_{12}}$ capacitors and subtracted using an operational amplifier 64 Op-Amp to determine the signal change. The data from several outputs or a matrix is multiplexed through a sample and hold circuit 66 to a final readout with CDS stage 68. The goal of circuit 66 is to remove charging noise of the mux capacitance.

Similar CDS circuits is implemented with on chip memory at the end of each additional stage of gain before the output as shown on FIG. 7. Further Noise Suppression is achieved by reducing the dark current of the amorphous photoconductor using thermoelectric or cryogenic cooling.

Figure 8:
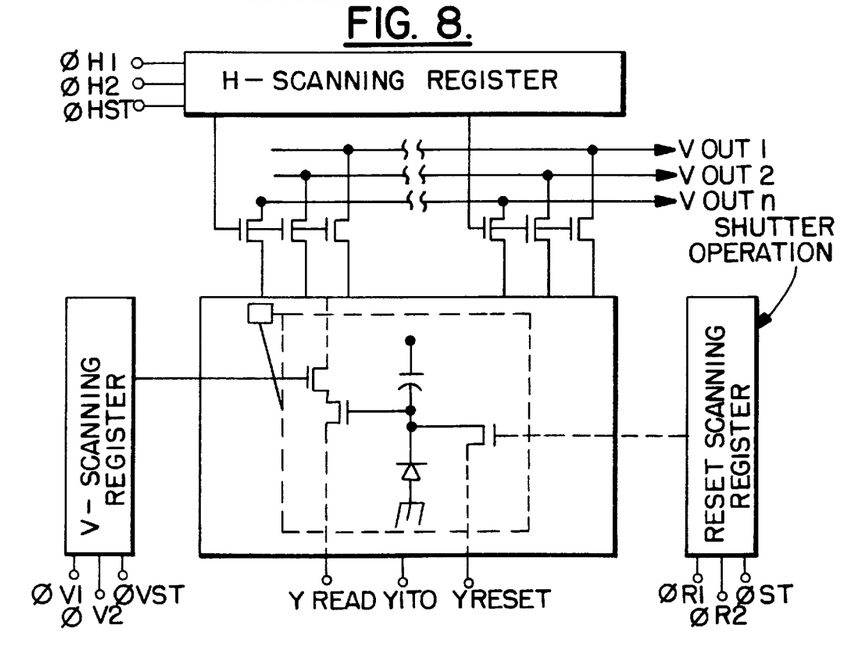
FIG. 8 shows a block diagram of a solid state readout circuit with an amplifier array to sense the photocurrent generated by the stacked photoconductive layers.

FIG. 8 shows a block diagram of a solid state readout circuit (Mux) with amplifier array (one per pixel) to sense the signal coming out of the a-Si–a-Se detector stack.

The photocurrent generated by the broadband photoconductive stack charges the pixel junction shown in FIG. 8. The photoconductive stack is biased by an indium tin oxide transparent electrode (VITO) such as illustrated in FIG. 2D. The pixel selection is performed by an X and Y matrix shown in FIG. 8. The amplified output is labeled Vread. The reset (V-reset) of the junction diode and the photoconductive stack is performed at the end of each frame or integration period.

Figure 9A:
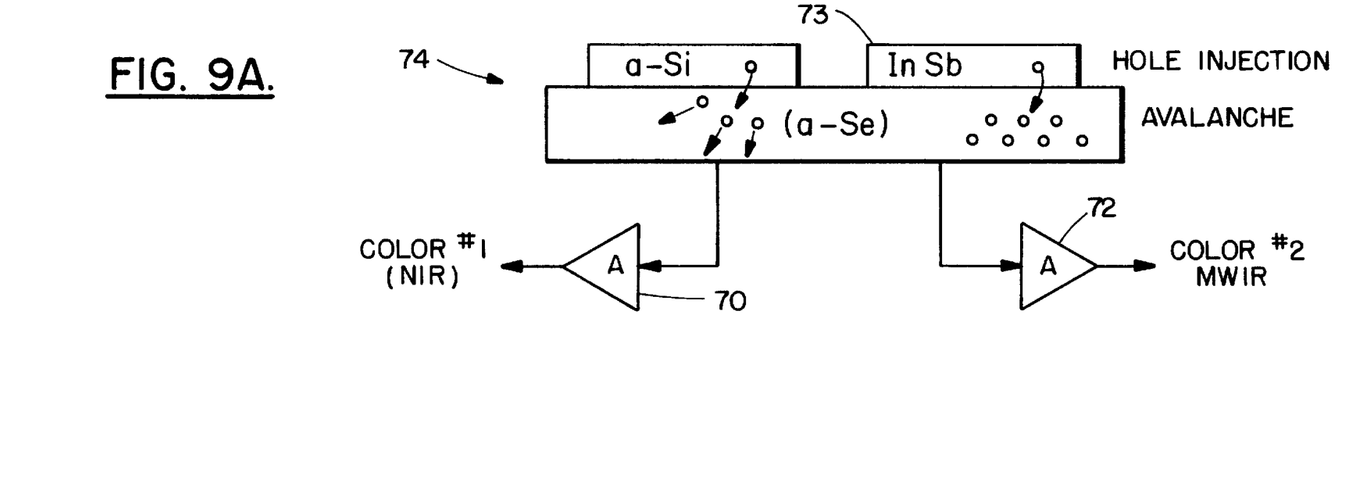
FIGS. 9A–9D show schematic illustrations of a photon counter with single or multiple spectral band readouts.
Figures 9B, 9C, 9D:
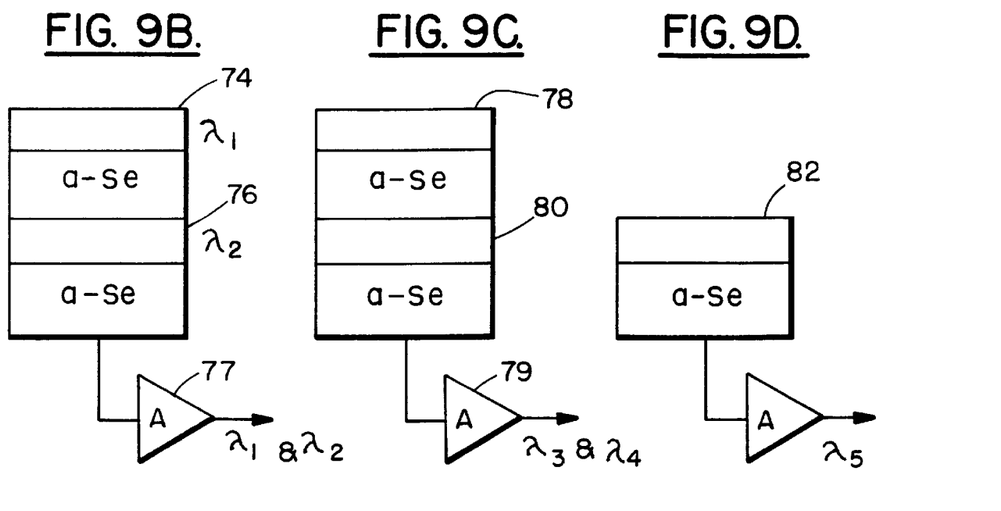

As shown on FIGS. 9A and 9B, the photoconductive stack may include two or more separate color detectors 70, 72 that are either connected in series or parallel to the pixel amplifier 74 or readout circuits. Hence, a photon counter may have a single or multiple readouts; one for each color, i.e., each color is connected to a separate readout amplifier as shown. In FIG. 9A the hole injection element can be composed of InSb, PbS, PbSe, PbTe or PbO-PbS layers.

In FIG. 9B, 9C and 9D different stacks are shown giving different amounts of avalanche gains to different spectral signals. In this case, the absorbers of each stack may be covered by or function as a bandpass filter to select one or several wavelengths.

In FIG. 9B, absorber 74 functions with a wavelength of $\lambda 1$ and absorber 76 functions with a wavelength $\phi$ $\lambda 2$. The readout from amplifier 77 is $\lambda 1$ and $\lambda 2$ in wavelength and $v1=g1\ v(\lambda 1)+g2\ v(\lambda 2)$. In FIG. 9B, absorber 78 functions with a wavelength of $\lambda 3$ and absorber 80 functions with a wavelength of $\lambda 4$ and the output wavelength from amplifier 79 is $\lambda 3+\lambda 4$ and $v3=g1v(\lambda 3)+g4v(\lambda 4)$. Likewise, in FIG. 9D absorber 82 functions with wavelength $\lambda 5$ and $v5=g5\ v(\lambda 5)$. The readout (multiplexer) device will contain memory devices to store the image samples from each spectral band. The spectral samples are readout each frame or in sequential color frames.

Figure 10:
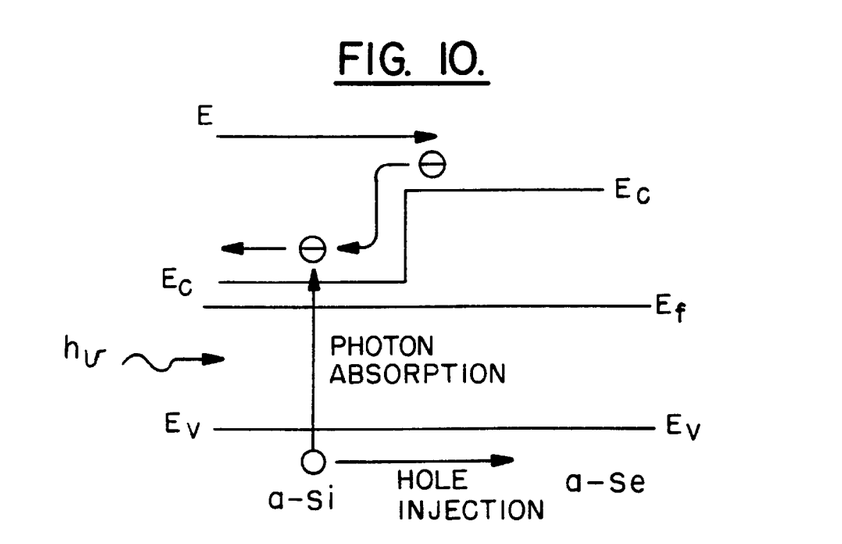
FIG. 10 shows an idealized energy band diagram of the a-Si/a-Se interface (photoconductor heterojunction).

FIG. 10 shows an idealized energy band diagram for the interface between the absorber semiconductor (a-Si or PbS etc. layers) and the avalanching a-Se layer.

The electric field is applied and the interface layer is designed to have no barrier to the flow of the holes in the direction of the electric field and to the flow of electrons in the opposite direction.

The interface may be graded during vacuum deposition to form a gradual transition from the electronic structure of the absorber to that of the avalanching layer hence avoiding interface barriers. This interface of the heterostructure may be doped to enhance the hole injection efficiency in one direction and the electron injection efficiency in the opposite direction. The first absorber in the stack may absorb the photosignal partially or completely. In the case of complete absorption the injected holes from the absorber into a-Se represent a complete image.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

I claim:

1. A photon sensing and counting device for low light level detection and imaging systems comprising a stack of photoconductive layers, said stack including at least one amorphous silicon photoconductive absorber layer to absorb near infrared and ultraviolet radiation to provide enhanced sensitivity to red and near infrared radiation for producing photocarriers of wavelength $\lambda_1$, said at least one amorphous silicon photoconductive layer being deposited on at least one amorphous selenium high gain avalanche photocarrier multiplying layer having enhanced sensitivity to blue radiation for producing photocarriers of wavelength $\lambda_2$, said at least one amorphous selenium layer providing multiplication of said photocarriers produced in said at least one amorphous silicon and at least one amorphous selenium layer, and output means including means for reading out and counting the photons from said at least one amorphous selenium layer, wherein said amorphous silicon layer produces photocarriers of red and near infrared wavelengths and wherein said amorphous selenium layer is doped with Te and As.

2. A photon sensing and counting device according to claim 1 wherein said output means includes a field effect transistor circuit including a memory capacitor for counting the photons produced by said at least one amorphous silicon photoconductive layer and said at least one amorphous selenium layer.

3. A photon sensing and counting device according to claim 1 wherein said at least one amorphous silicon photoconductive layer is coupled to a high avalanche photoconductive layer means responsive to input image radiation for producing an output signal in response to said input radiation; and wherein said at least one amorphous selenium layer is a high gain pixel level amplification means connected to said photoconductive means for amplifying said output signal from said photoconductive means.

4. A photon sensing and counting device according to claim 3 wherein said amorphous selenium high gain pixel level amplification means includes a layer containing at least one amplified metal-oxide silicon (AMOS) amplifier circuit.

5. A photon sensing and counting device according to claim 4 wherein said stack of photoconductive layers includes a high gain avalanche photoconductive (HARP) diode composed of an amorphous selenium (a-Se) photoconductive layer and a solid state diode layer disposed on said amplified metal-oxide silicon (AMOS) layer.

6. A photon sensing and counting device according to claim 5 wherein said amplified metal-oxide silicon (AMOS) layer contains a plurality of amplified metal-oxide silicon (AMOS) amplifier circuits connected to each other.

7. A photon sensing and counting device according to claim 5 including a first plurality of said stacks of photoconductive layers and a second plurality of AMOS read-out circuits wherein said amplified metal-oxide silicon (AMOS) layer contains a plurality of said stack stacks of photoconductive layers of amplified metal-oxide silicon (AMOS) amplifier circuits wherein said AMOS amplifier circuits of a number of said stacks are multiplexed and connected to one of said AMOS read-out circuit.

8. A photon sensing and counting device according to claim 5 wherein said stack of photoconductive layers further includes a hole blocking contact layer disposed on said amorphous selenium layer and a radiation responsive biased transparent electrode disposed on said hole blocking contact layer, and an electron blocking contact layer disposed between said amorphous selenium and an electron blocking contact layer disposed between said amorphous selenium layer and said solid state diode layer.

9. A photon sensing and counting device according to claim 5 wherein said solid state image sensing system is a hybrid structure wherein said amorphous selenium layer is deposited on a flat, inert substrate and connected via bumps of conductive material to said amplified metal-oxide silicon (AMOS) layer.

10. A photon sensing and counting device according to claim 4 wherein said solid state diode layer is a silicon junction diode formed by an N+ diffusion in a P substrate.

11. A photon sensing and counting device according to claim 4 wherein said solid state diode layer is a silicon junction diode formed by an N+ diffusion in a silicon MIS detector.

12. A photon sensing and counting device according to claim 4 further including at least two separate optical detector means connected to said amorphous selenium high gain avalanche layer, each of said detectors responsive to a separate color wavelength, through bandpass filter action, for producing an output signal representative of said color which is stored in the memory element of the read-out circuit and which is read sequentially or in parallel each frame.

13. A photon sensing and counting device according to claim 12 further including an indium antimony absorber layer disposed on said at least one amorphous selenium high gain avalanche layer.

14. A photon sensing and counting system including a photon detector device having stacked photoconductive layers of at least one amorphous silicon photoconductive layer disposed on at least one amorphous selenium layer for producing first $\lambda_1$, wavelength photons in response to red and near infrared wavelengths radiation and second $\lambda_2$ wavelength photons in response to blue wavelength radiation, a frame integrator means connected to said photon detector means, a dark current correction means, a spectral filter means, a photon rate calculation means connected to said spectral filter means to calculate photon count, a fixed pattern noise corrector means connected to said photon detector means, said frame integrator, said dark current detector means and to said spectral filter means and said photon rate calculation means, and an image display connected to said fixed pattern noise corrector means for displaying a photon count.

* * * * *